United States Patent [19]

Zumoto et al.

[11] Patent Number: 4,986,214

[45] Date of Patent: Jan. 22, 1991

[54] THIN FILM FORMING APPARATUS

[75] Inventors: Nobuyuki Zumoto; Toru Takahama; Susumu Hoshinouchi; Noriko Morita, all of Hyogo, Japan

[73] Assignee: Mitsubishi Denki Kabushiki Kaisha, Tokyo, Japan

[21] Appl. No.: 133,837

[22] Filed: Dec. 16, 1987

[30] Foreign Application Priority Data

Dec. 16, 1986 [JP] Japan .................. 61-300379
Jun. 16, 1987 [JP] Japan .................. 62-147877

[51] Int. Cl.$^5$ .............................. C23C 16/48
[52] U.S. Cl. .................... 118/722; 118/723; 156/613; 156/DIG. 68; 423/446
[58] Field of Search ............... 118/722, 723; 423/446; 156/613, DIG. 68

[56] References Cited

U.S. PATENT DOCUMENTS 4,705,595 11/1987 Okudaira .................. 156/646

FOREIGN PATENT DOCUMENTS 61-224318 of 0000 Japan .
0039823 3/1985 Japan .
0204548 4/1986 Japan .

Primary Examiner—Richard Bueker
Attorney, Agent, or Firm—Sughrue, Mion, Zinn, Macpeak & Seas

[57] ABSTRACT

A thin film forming apparatus of the present invention comprises: a reaction chamber for receiving therein a substrate and a thin film forming gas; an ultraviolet laser beam oscillator for generating an ultraviolet laser beam for causing dissociation of the thin film forming gas to thereby form a thin film over the surface of the substrate; and a plasma generator for generating ions for controlling growth of a thin film.

2 Claims, 2 Drawing Sheets

THIN FILM FORMING APPARATUS

BACKGROUND OF THE INVENTION

The present invention relates to a thin-film forming apparatus utilizing laser beam and more aparticularly to a thin-film forming apparatus capable of forming thin diamond films, cubic system boron nitride and the like having thermal conductivity, electrical insulation properties and a high degree of purity at a high rate over the surfaces of substrates which are substantially maintained at room temperature as an average temperature while controlling the qualities of thin films being formed In order to carry out the thin film forming techniques in practice, it has been desired that a thin film forming process be carried out at low temperatures so that the adverse thermal effects on the substrates can be avoided and concurrently that the thin film formation can be carried out at a high growth or deposition rate in order to reduce the thin-film formation costs.

In order to attain the above-mentioned conditions, there has been proposed a novel thin-film forming technique called a laser CVD process in which thin-film-forming gases are optically dissociated by high-energy photons released from a ultraviolet laser beam. According to this process, gases can be dissociated only by the high-energy photons so that the process has a feature that the reaction products can be deposited on the substrate at a high deposition rate at low temperatures. However, it has been difficult to form high-quality thin films in a stable manner, since there is not provided a mechanism for controlling the composition of the reaction products resulting from the reaction between the photons and the thin-film-forming gases or for controlling the process for forming a thin film of a reaction product on a substrate.

FIG. 1 is a sectional view of a conventional laser beam CVD apparatus utilizing a laser beam which is disclosed, for instance, in Applied Physics Letter, Vol 43, No. 5, pp 454–456.

In FIG. 1, reference numeral 1 represents an ultraviolet laser beam oscillator; 2, an ultraviolet laser beam; 3, a cylindrical telescope for attaining an energy density of the laser beam required for dissociation of thin-film-forming gases; 4, a window adapted to isolate the thin-film-forming gas atmosphere from the surrounding atmosphere and to introduce the ultraviolet laser beam 2 into a reaction chamber 5; 51, an inlet port for introducing the thin-film-forming gas mixture into the reaction chamber 5; 52, an output port for discharging the thin-film-forming gas mixture to the surrounding atmosphere; 6, a substrate; 7, a suceptor incorporating therein a heater for heating the substrate 6.

The ultraviolet laser beam 2 emitted from the ultraviolet laser oscillator 1 is concentrated by the cylindrical telescope 3 so as to have an energy density sufficient to cause the dissociation of the thin-film-forming gases and then is introduced through the window 4 into the reaction chamber 5 having the thin-film-forming gas atmosphere. The ultraviolet laser beam 2 passes in parallel with the substrate 6 along the path spaced apart therefrom by a few millimeters, thereby causing the dissociation of the thin-film-forming gases. The reaction product is deposited over the surface of the substrate 6 by diffusion.

However, there is a problem in that a thin film formed by the reaction product resulting from the dissociation of the thin-film-forming gases by the high-energy photons includes impurities depending upon the kinds of thin-film-formation gases in that a desired crystal structure may not be obtained as expected. In view of the above, the conventional CVD apparatus shown in FIG. 1 employs a process wherein the surface of the substrate is heated to temperature of hundreds of degrees (° C) by the heater incorporated in the suceptor, thereby controlling the quality of a thin film being deposited on the substrate.

As described above, it has been difficult to obtain thin films having desired properties or quality by the conventional laser beam thin-film forming apparatus, since they have no mechanism for controlling the reaction products. In addition, in order to control the quality of a thin film, only the process of heating the surface of the substrate to hundreds of degrees (° C) has been used in the conventional apparatus In other words, it is impossible to control the quality of the thin films at low temperatures.

SUMMARY OF THE INVENTION

The present invention is made to overcome the above and other problems encountered in the conventional thin-film forming apparatus, and therefore an object of the present invention is to provide a thin film forming apparatus in which a thin film is formed at a low temperature and at a high deposition rate by utilizing the dissociation of thin-film-forming gases by the high-energy photons, with the step for forming a thin film being controlled so that the thin film having the quality as desired can be obtained.

Therefore, according to one aspect of the present invention, a thin film forming apparatus comprises: a a reaction chamber for receiving therein a substrate and a thin film forming gas; an ultraviolet laser beam oscillator for generating an ultraviolet laser beam for causing dissociation of the thin-film-forming gas to thereby form a thin film over the surface of the substrate; and a plasma generator for generating ions for controlling growth of a thin film.

According to the present invention, the thin-film-forming gases and the thin-film-forming controlling gas are supplied by independent systems, respectively, and the thin-film-forming gases are subjected to the ultraviolet laser beam while the control gas is subjected to the plasma generation process by the electron-cyclotron-resonance plasma generator (to be referred to as "the ECR plasma generator" in this specification hereinafter). The plasma thus generated acts on the dissociated thin-film-forming gases and the surface of the substrate, whereby the thin film having the desired quality can be obtained.

Furthermore, the present invention has another object to provide a thin-film-forming apparatus in which a thin film is formed at a low temperature and at a high formation or deposition rate by utilizing the dissociation of the thin-film-forming gases due to the high energy photons, with the plasma generator generating a plasma concurrently to control the steps of forming a thin film so that the thin film having desired quality can be obtained in an efficient manner.

To achieve the above and other objects, according to another aspect of the present invention, a thin film forming apparatus comprises a first chamber which is filled with thin-film-forming gases, a second chamber communicated with the first chamber through a communication passage, a suceptor disposed in the communication passage for supporting a substrate upon which is to be formed a thin film, an ultraviolet laser beam oscillator for emitting an ultraviolet laser beam into the first chamber thereby dissociating the thin-film-forming gases to form a thin film over the surface of the substrate, a plasma generator for emitting the thin-film-formation control ions into the second chamber and a driving means for causing the alternate displacement of the substrate supported by the suceptor in relation to the first and second chambers.

According to the present invention, the first and second chambers are defined and intercommunicated witn each other through the communication passage so that there exists a pressure difference between them. When the substrate is reciprocatedly transferred between the first and second chambers, a thin film is deposited in the first chamber while the thin film formation is controlled in the second chamber by the plasma supplied from the plasma generator.

The above and other objects, effects and features of the present invention will become more apparent from the following description of the preferred embodiments of the present invention in conjunction with the accompanying drawings.

DETAILED DESCRIPTION OF THE PREFERRED EMBODIMENTS

Figure 1:
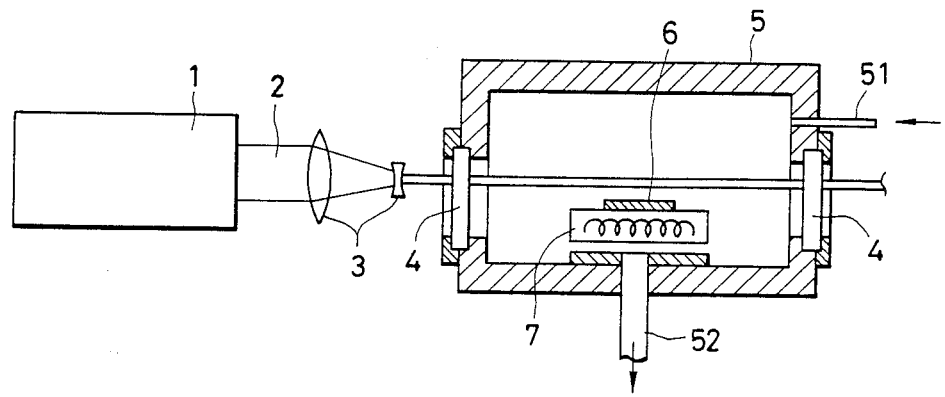
FIG. 1 is a sectional view illustrating a conventional laser beam thin-film forming apparatus.
Figure 2:
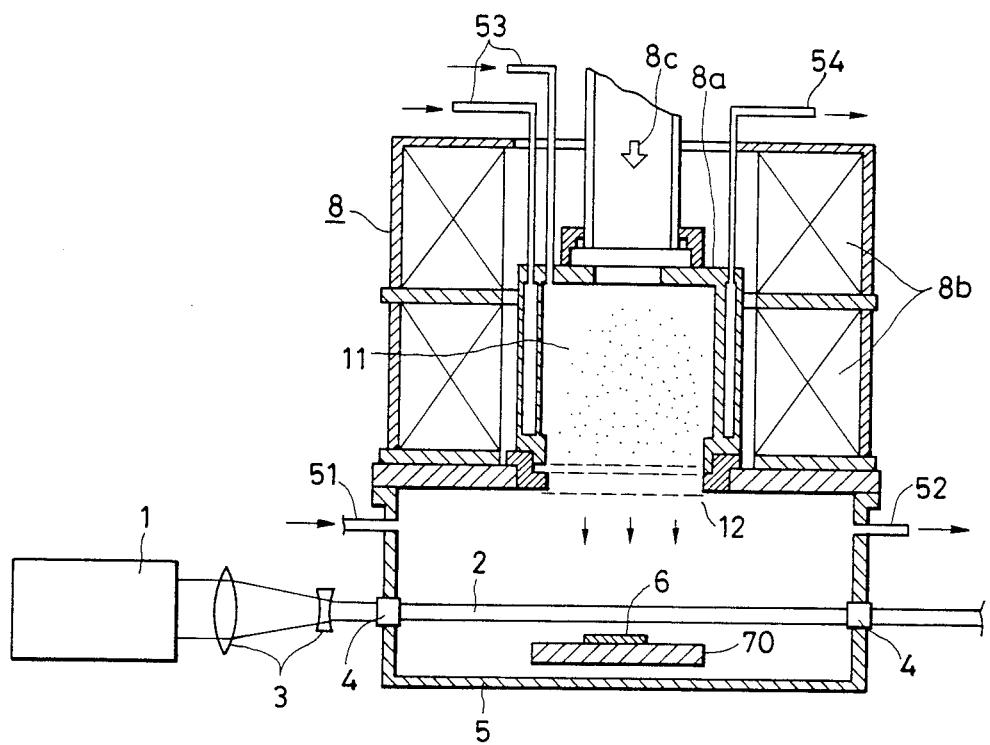
FIG. 2 is a sectional view of a first preferred embodiment of a laser beam thin-film-forming apparatus in accordance with the present invention.

A thin film forming apparatus of the first preferred embodiment of the present invention will be described, with reference to FIG. 2. FIG. 2 shows, especially, a thin diamond film forming apparatus to which is applied the first embodiment of the present invention. In FIG. 2, reference numeral 1 designates an ultraviolet laser beam oscillator. 2 designates an ultraviolet laser beam. 3 designates a cylindrical telescope, and 4 designates a window. 5 designates a reaction or process chamber. 6 designates a substrate, and 70 designates a suceptor for supporting the substrate 6. 8 designates an ECR plasma generator. Reference numeral 8a designates a plasma generation chamber. 8b designates an air-core coil for generating a magnetic field for confining the plasma generated by the plasma generating chamber 8a, and 8c designates a microwave (at a frequency of 2.45 GHz). The ECR plasma generator 8 comprises the plasma generation chamber 8b, a microwave source (not shown) for generating numeral 11 denotes a hydrogen plasma. 12 denotes an ion-accelerating mesh electrode. 51 designates an inlet port through which is supplied a thin-film-forming gas $CH_4$. 52 designates a discharge port on the side of a vacuum pump. 53 designates an inlet port through which is introduced an ECR plasma source gas $H_2$. 54 designates an outlet port on the side cf a vacuum pump (not shown).

The thin-film-forming gas of methane ($CH_4$) (at tens of Torr) in the reaction chamber 5 is optically dissociated by the two-photon absorption of the ultraviolet laser beam 2 (having a peak output of 10 $\mu m/cm^2$) such as a ArF exima laser which has been shaped by the cylindrical telescope 3 to have a desired energy density. On the other hand, the hydrogen plasma or hydrogen ions in the plasma generation chamber 8a are suitably accelerated by the ion acceleration mesh electrode 12 and impinge on the surface of the substrate 6 in the chamber 5. During the initial stage of the formation of a thin film, the hydrogen ions impinge the surface of the substrate 6 to form crystal deformations so that the core required for the growth of a diamond crystal can be easily formed. In the step after the formation of the core, when the energy of about hundreds of electron volts (eV) is provided to the hydrogen ion, the etching process is accelerated so that the growth of a graphite crystal which occurs simultaneously with the growth of a diamond crystal can be suppressed. As a result, a thin diamond film having desired qualities and containing no impurity at all can be obtained. Furthermore, the ECR plasma generator (Electron-Cyclotron-Resonance plasma generator) has the ability of increasing the plasma density 10 or more times as high as that of the plasma density attained by other types of plasma generators so that the growth of a thin film is carried out at a high deposition rate and is satisfactorily controlled. Furthermore, according to the present invention, it is possible to achieve the film formation with keeping the substrate at room temperature without heating.

Although the formation of the thin diamond film is described above, it is to be understood that the first embodiment of the present invention can be equally used to form other various films. For instance, when a mixture of $N_2$ and $H_2$ is supplied from the plasma source while $B_2H_6$ is introduced into the reaction chamber 5 as film forming gas, a cubic-system boron nitride film having a high degree of quality can be obtained at a low temperature substantially equal to room temperature and at a high deposition rate in the same manner as described above.

In the film forming apparatus of the first embodiment shown in FIG. 2, the ECR plasma generating device 8 may be replaced with another general-type microwave discharge plasma generating device using a magnetic field. In this case, the microwave 8c has a frequency in a range of from hundreds of MHz to tens of GHz. In such a microwave discharge plasma generating device, the pressure of the generated hydrogen plasma can be selected or changed in a range cf from $10^5$ to tens of torr. Therefore, in order to form a film on a substrate, the microwave discharge plasma generating device can be coupled with the reaction chamber 5 by maintaining the pressure of the hydrogen plasma equal to the pressure of the film-forming gas in the reaction chamber 5, through selecting the pressure of the hydrogen plasma in the range of from $10^{-5}$ to tens of torr. As a result, it becomes possible to select the pressure condition in accordance with the purpose or aim of operating the film forming apparatus. For example, in order to form a film with uniform thickness, a low pressure (about $10^{-5}$ torr) may be selected. In this case, however, the film forming rate is low. In order to form a film with high rate or speed, a high pressure (about tens torr) can be selected. Particularly, the preferable pressure of the hydrogen plasma gas and the film-forming gas for practical use of the film forming device may be in a range a of few torr to tens of torr. For example, the film forming device shown in FIG. 2 with the plasma generating device 8 comprising the microwave discharge plasma generating device may be operated with the pressure of the plasma gas and the film-forming gas being about 10 torr.

As described above, the film formation apparatus of the first embodiment of the present invention comprises the reaction chamber in which is placed the substrate, the ultraviolet laser oscillator for emitting the ultraviolet laser beam which causes the dissociation of the thin-film forming gas to thereby form a thin film over the surface of the substrate, and the microwave-used discharge plasma generating device using a magnetic field, such as an electron-cyclotron-resonance type plasma generator, for generating ions for controlling the growth of a thin film. As a result, the growth of desired crystal cores are enhanced while the growth of undesired crystal cores are suppressed. Therefore, the present invention can provide a thin-film-forming apparatus in which the control of the qualities of thin films can be easily carried out and it becomes possible to grow a thin film having a high degree of quality at a low temperature substantially equal to room temperature but at a high deposition rate.

Figure 3:
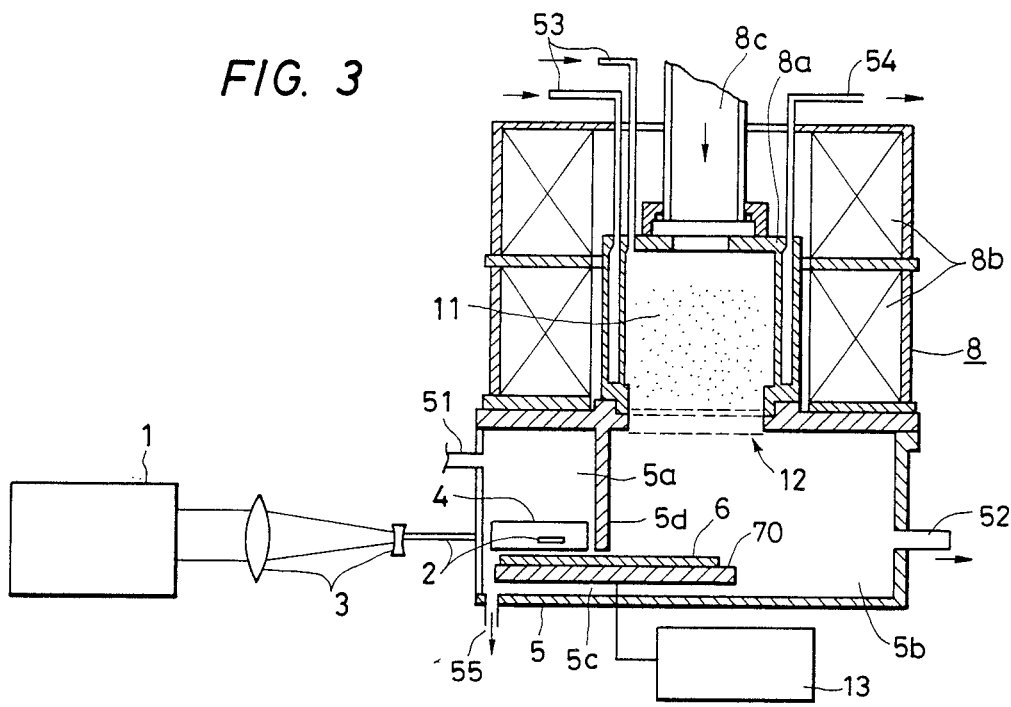
FIG. 3 is a sectional view of a second preferred embodiment of a laser beam thin-film-forming apparatus in accordance with the present invention.
Figure 4:
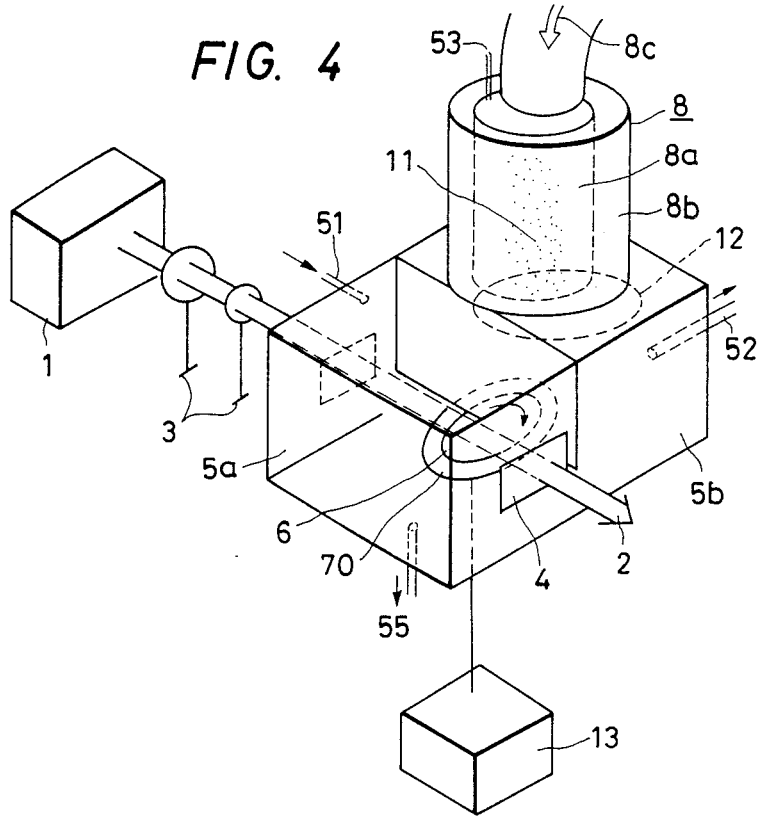
FIG. 4 is a sectional view of the apparatus shown in FIG. 3.

A thin film forming apparatus of a second preferred embodiment of the present invention will be described hereinafter with reference to FIGS. 3 and 4. FIG. 3 shows, especially, a thin diamond film forming apparatus to which is applied the second embodiment of the present invention. FIG. 4 is a perspective view of the apparatus shown in FIG. 3. In FIG. 3, reference numeral 5a represents a first chamber which receives through a window 4 an ultraviolet laser beam 2 emitted from an ultraviolet laser oscillator 1 and shaped by a cylindrical telescope 3 into a laser beam having a desired energy density. A thin-film-forming gas is introduced through an inlet port 51 into the first chamber 5a. Reference numeral 5b is a second chamber which is communicated with the first chamber 5b through a communication passage 5c. 13 designates a driving device for rotating a suceptor 70 sc that a substrate 6 alternately passes through the first and second chambers 5a and 5b. 8 designates an electron-cyclotron-resonance plasma generator (ECR plasma generator). Except the above-mentioned reference numerals, the same reference numerals are used to designate similar parts shown in FIG. 2. In FIG. 3, the ultraviolet laser beam 2 is shown as traveling from the left side to the right side, but it is noted that the ultraviolet laser beam 2 actually travels from a window behind the first chamber 5a to the front window, as shown in FIG. 4.

Next, the mode of operation of the apparatus of the second preferred embodiment with the above-mentioned construction will be described A thin-film-forming gas of methane ($CH_4$) (at tens of Torr) is introduced through the inlet port 51 into the first chamber 52 and is optically dissociated by the two-photon absorption of the ultraviolet laser beam 2 (having a peak output of 10 $\mu m/cm^2$) such as the ArF exima laser shaped by the cylindrical telescope 3 to have a suitable level of energy density.

Meanwhile, the hydrogen ions generated by the ECR plasma generator 8 are accelerated to a suitable velocity by the ion-acceleration mesh electrode 12 and impinge upon the surface of the substrate 6 within the second chamber 5b to form crystal deformations on the surface of the substrate 6 so that the formation of a core for the growth of the diamond crystal is facilitated. When the hydrogen ion is given hundreds of electron volts (eV) after the formation of the core, the etching process is enhanced so that the growth of graphite crystals which occurs simultaneously with the formation of the growth of diamond crystals is suppressed. As a result, a diamond thin film having a high degree of quality and containing no impurity can be obtained. The ECR plasma generator 8 can increase the plasma energy 10 or more times higher than the energy obtained by other general types of plasma generators so that the process for forming a thin film can be accomplished at a high growth rate and can be satisfactorily controlled. In addition, during the growth of a thin film, the substrate can be maintained at a low temperature substantially equal to room temperature so that it is not required to heat the substrate.

According to the second embodiment, the reaction chamber is divided into the first chamber 5a in which a thin film is formed and the second chamber 5b in which the thin film being formed is subjected to the bombardment of the plasma ions and the first and second chambers 5a and 5b are intercommunicated with each other through a communication passage 5c in which is disposed the substrate 6. Therefore, according to the second embodiment, in the case where there exists a difference between preferable pressures for thin film forming gas and for plasma gas, it is possible to maintain a pressure difference between the first and second chambers 5a and 5b. In other words, even where a preferable pressure of the thin film forming gas atmosphere is in a range of $10^0$ to tens of Torr but the ion atmosphere pressure for plasma is in a range of $10^{-5}$ to $10^{-3}$ Torr, it is possible to maintain pressure difference between the first and second chambers 5a and 5b. Furthermore, in order to ensure the above-mentioned pressure difference, the sizes of the communication passage 5c and the outlet ports 52 and 55 are suitably selected and the gas discharge rate is suitably controlled. For instance, it is preferable that the substrate 6 and the wall 5d are spaced apart from each other by a few millimeters.

Under these conditions, the suceptor 7 upon which is mounted the substrate 6 is rotated or moved in translation by the suceptor driving device 13, so that the surface of the substrate 6 is alternately transferred into the plasma-ion atmosphere and the thin-film-forming atmosphere. More particularly, in the second chamber 5b, the core for the crystal growth is formed on the surface of the substrate 6. Then, the substrate is moved into the first chamber 5a due to the displacement of the suceptor 7 sO that a thin film is formed on the surface of the substrate 6 with methane gas dissociated by the laser beam. After the thickness of the thin film is increased of the order on tens of angstrom, the substrate is returned into the second chamber 5b so that graphite which has grown simultaneously with the growth of diamond crystals is removed by the hydrogen ions. In this manner, the film formation (that is, the growth of diamond crystals) and the removal of graphite are repeated so that it becomes possible to obtain a thin diamond film having a satisfactory degree of quality.

In this case, it may be considered that it is sufficient to only rotate the suceptor 7, but when the rotary motion of the suceptor 7 is combined with the translation motion (parallel displacement), a thin film can be formed more uniformly.

Although the above description of the second preferred embodiment of the present invention is related to an apparatus of formation of a thin diamond film, it is to be understood that as in the case of the first embodiment, the second preferred embodiment is not limited to the formation of thin diamond films and that it can be equally used for forming various thin films. For instance, when the mixtured gas of $N_2$ and $H_2$ is a plasma source gas while $B_2H_6$ is made to flow through the reaction chamber, a high quality cubic-system boron nitride can be formed in the same manner as described above at a high growth rate while the substrate is maintained at a relatively low temperature substantially equal to room temperature.

As described above, the film forming apparatus of the second preferred embodiment of the present invention comprises the first chamber filled with a thin-film-forming gas or mixture, the second chamber intercommunicated with the first chamber through the communication passage, a suceptor disposed in the communication passage for supporting the substrate, an ultraviolet laser beam oscillator for emitting the ultraviolet laser beam into the first chamber so as to cause the dissociation of the thin-film-forming gas to thereby form a thin film over the substrate, the plasma generator for generating a plasma which in turn supplies the thin-film-forming controlling ions into the second chamber, and the driving device capable of alternately moving the substrate on the suceptor between the first and second chamber. Therefore, the present invention has the effects that the quality of a thin film can be easily controlled and that the thin film can be uniformly formed at a high growth rate while the substrate is maintained at a relatively low temperature substantially equal to room temperature.

In addition, various modifications and variations can be effected without departing from the scope of the present invention.

What is claimed is:

1. A thin forming apparatus, comprising:
   a reaction chamber for receiving therein a substrate and a thin film forming gas;
   an ultraviolet laser beam oscillator for generating an ultraviolet laser beam which passes in parallel with said substrate along a path spaced apart therefrom for causing dissociation of said thin film forming gas to thereby form a thin film over the surface of said substrate;
   and a plasma generator for generating ions for controlling growth of a thin film, wherein said reaction chamber comprises:
   a first chamber for receiving therein a thin film forming gas, said first chamber receiving said laser beam from said laser beam oscillator;
   a communication passage portion communicated with said first chamber;
   a second chamber communicated with said communication passage portion, said second chamber receiving said ions generated in said plasma generator;
   a suceptor disposed in said communication passage portion for supporting said substrate thereon; and
   a driving means for alternately moving said suceptor between said first and second chambers.

2. A thin film forming apparatus, comprising:
   a first chamber for receiving a thin film forming gas;
   a second chamber intercommunicated with said first chamber through a communication passage;
   a suceptor disposed in said communication passage for supporting a substrate upon which is to be formed a thin film;
   an ultraviolet laser beam oscillator for generating and emitting an ultraviolet laser beam into said first chamber so as to cause dissociation of said thin-film forming gas, thereby forming a thin film over said substrate;
   a plasma generator for feeding into said second chamber ions for controlling the growth of a thin film; and
   a driving means for alternately moving said suceptor between said first and second chambers.

* * * * *